(12) United States Patent
Muthers et al.

(10) Patent No.: US 9,739,845 B2
(45) Date of Patent: Aug. 22, 2017

(54) METHOD FOR TESTING A SIGNAL PATH

(71) Applicant: Micronas GmbH, Freiburg (DE)

(72) Inventors: David Muthers, Denzlingen (DE);
Joachim Ritter, Loerrach (DE);
Michael Wagner, Freiburg (DE);
Markus Von Ehr, Freiburg (DE);
Thomas Kauter, Freiburg (DE)

(73) Assignee: TDK-Micronas GmbH, Freiburg (DE)

(*) Notice: Subject to any disclaimer, the term of this patent is extended or adjusted under 35 U.S.C. 154(b) by 110 days.

(21) Appl. No.: 14/872,729

(22) Filed: Oct. 1, 2015

(65) Prior Publication Data

US 2016/0097806 A1    Apr. 7, 2016

(30) Foreign Application Priority Data

Oct. 1, 2014 (DE) ................ 10 2014 014 309

(51) Int. Cl.
*G01R 31/3187* (2006.01)
*G01R 33/07* (2006.01)
*G01R 35/00* (2006.01)

(52) U.S. Cl.
CPC .............. *G01R 33/07* (2013.01); *G01R 35/00* (2013.01)

(58) Field of Classification Search
CPC  G01R 31/3187; G01R 33/0023; G01R 33/02; G01R 33/07; G01R 33/09; G01R 35/00; G01R 31/31701; G01R 31/31716; G01R 31/318572; G01R 31/31926; G01R 31/2884; H01H 83/04; H04B 17/14; H04B 17/19; G01P 21/00; G11C 2029/0409; G11C 29/50; G06F 11/0751; G06F 11/22

See application file for complete search history.

(56) References Cited

U.S. PATENT DOCUMENTS

| | | | |
|---|---|---|---|
| 6,252,503 B1 * | 6/2001 | Berger | G01D 18/006 340/506 |
| 6,968,484 B2 | 11/2005 | Hummel | |
| 7,161,480 B2 * | 1/2007 | Hammerschmidt | G01R 31/2829 340/514 |
| 7,301,353 B2 | 11/2007 | Ausserlechner | |
| 7,492,178 B2 | 2/2009 | Bidenbach et al. | |

(Continued)

FOREIGN PATENT DOCUMENTS

| | | |
|---|---|---|
| DE | 195 39 458 A1 | 4/1997 |
| DE | 198 19 265 C1 | 8/1999 |

(Continued)

*Primary Examiner* — Vinh Nguyen
(74) *Attorney, Agent, or Firm* — Muncy, Geissler, Olds & Lowe, P.C.

(57) ABSTRACT

A method for testing a signal path of a first IC formed as a monolithically integrated circuit on a semiconductor body together with a magnetic field sensor and has a signal output and a power supply connection and a test mode state and a normal operating state. A power supply of the first IC is switched off, and a signal output is connected with a reference potential, and the power supply of the first IC is switched on and the signal output is disconnected from the reference potential. Subsequently in a test mode state, a self-test is performed in the first IC and a test pattern is configured at the signal output or at the power supply connection and the test pattern is evaluated by the control unit for testing of the signal path.

12 Claims, 1 Drawing Sheet

(56) References Cited

U.S. PATENT DOCUMENTS

| | | | |
|---|---|---|---|
| 7,756,680 B2* | 7/2010 | Hammerschmidt ... | G08C 25/00 |
| | | | 702/183 |
| 7,761,756 B2 | 7/2010 | Bidenbach et al. | |
| 7,928,743 B2 | 4/2011 | Ausserlechner | |

FOREIGN PATENT DOCUMENTS

| | | |
|---|---|---|
| DE | 10 2004 021 863 A1 | 12/2005 |
| DE | 10 2005 028 461 A1 | 12/2006 |
| DE | 10 2006 022 985 A1 | 11/2007 |
| DE | 10 2007 025 001 | 12/2008 |

* cited by examiner

METHOD FOR TESTING A SIGNAL PATH

This nonprovisional application claims priority to German Patent Application No. 10 2014 014 309.0, which was filed in Germany on Oct. 1, 2014, all of which is herein incorporated by reference.

BACKGROUND OF THE INVENTION

Field of the Invention

The invention relates to a method for testing a signal path.

Description of the Background Art

Methods for testing monolithically integrated magnet field sensors are known from DE 195 39 458 C2, from DE 10 2005 028 461 A1, which corresponds to U.S. Pat. No. 7,492,178 which is incorporated herein by reference, and from DE 10 2004 021 863 A1, which corresponds to U.S. Pat. No. 7,301,353.

SUMMARY OF THE INVENTION

It is therefore an object of the invention to provide a method that furthers the current state of technology.

According to an exemplary embodiment of the invention, a method for testing the signal path of a first IC is provided, wherein the first housed IC is configured as a monolithically integrated circuit on a semi-conductor body together with a magnetic field sensor and has a signal output and a power supply connection and a test mode state and a normal operating state, wherein during normal operating state an output signal is provided at the signal output and wherein the output signal is dependent on the signal which is tapped at the magnetic field sensor, and a second, housed IC is provided, wherein the second IC has a control unit and via the control unit there is a switch from the normal operating states to the test mode state, wherein in a first step the power supply of the first IC is switched off and in a second step, the signal output is connected with a reference potential, and in a third step the power supply of the first IC is switched on, and in a fourth step the signal output is disconnected from the reference potential, and subsequently in the test mode state, a self-test is performed in the first IC and a test pattern is configured at the signal output or the power supply and the test pattern is evaluated by the control unit in order to test the signal path.

The power supply and the signal output of the first IC can be interconnected with the respective inputs and outputs of the second IC. It is further noted that when testing the signal path, a magnetic field acting directly on it has hardly any influence on a basic function test. In contrast, the influence of an acting magnetic field does exist when determining the offset voltage of a magnetic field sensor. It is especially advantageous to configure the magnetic field sensor as a hall sensor and especially advantageous to configure it as a lateral or vertical hall sensor. Furthermore, it is noted that the reference potential is preferably configured as ground potential or as power supply potential.

An advantage of the invented method is that the method allows for testing of the complete signal path of a housed first IC, wherein the first IC is interconnected with a second IC and at the same time the interconnection between the two ICs can be tested. For this purpose a switch to the test mode state is effected by clamping of the signal output cable during the time that the supply voltage is switched on. The costly production of an additional testing connection is avoided. It is also possible to repeat the testing procedure at any time, i.e. without any special assistive devices such as external circuits, due to the fact that with the control unit the implementation of one program is sufficient. A change in the interconnection between the second IC, also known as the "host", and the first IC, also known as the "slave" is no longer necessary.

In an embodiment, the control unit waits a predetermined time between the third and fourth steps and/or verification whether the supply voltage of the first IC is stable. This provides an especially simple and cost-effective solution for a signal path test.

In an embodiment, the magnetic field sensor can be interconnected with a test current source in the test mode state and preferably one and/or more different levels of a test current are fed into the magnetic field sensor. Using the test current, the effect of an external magnetic field is reproduced. In this way, it is possible to test the behavior of the first IC even without an external magnetic field.

In an embodiment for the IC end test during testing of the signal path, the first IC can be arranged in a mounting fixture of a device or can be interconnected with the second IC in a field application. The latter application also allows for the execution of a power-on self-test in the respective application.

In an embodiment, exactly one two-wire transmission or exactly one three-wire transmission can be arranged between the first IC and the second IC. Such circuits are known as CAN or LIN buses in the automotive sector. The control unit is hereby integrated into the host IC or master IC.

In an embodiment, the magnetic field sensor can have numerous connections, wherein during the test mode state the test current source can be interconnected with different connections of the magnetic field sensor on a rotating basis. The influence of an applied, external magnetic field sensor can be suppressed by shifting and with a summation of the individual signals tapped at the magnetic field sensor. It is also advantageous to alternatingly operate as a current sink and as a current source the test current source on at least one connection of the magnetic field sensor. In this way, the sign of the magnetic field dependent portion of the signal can be changed whereas the sign of the offset voltage remains the same. In another embodiment, the offset voltage values of the magnetic field sensor can be determined for varying levels of the test current by the control unit during test mode state.

In an embodiment, the first IC can be shifted from the test mode state to the normal operating state after running of the self-test and without a trigger signal of the second IC.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
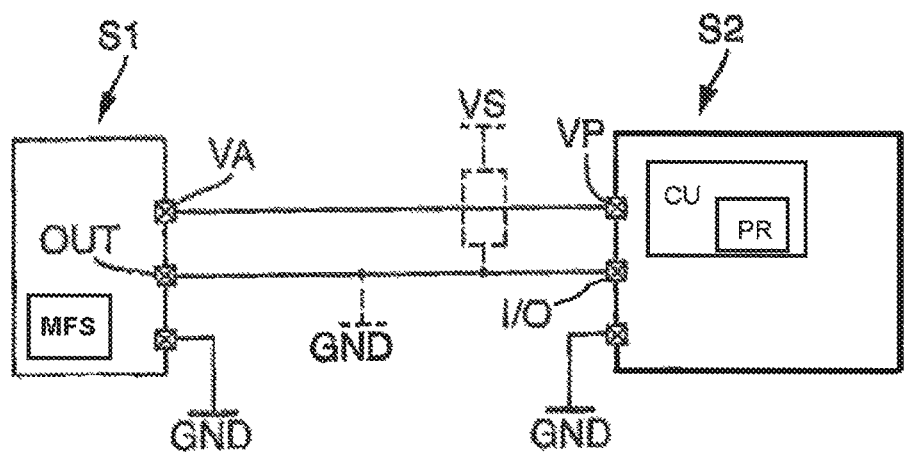
FIG. 1 is a view of a circuit configuration to perform the method.

The illustration of FIG. 1 shows a view of a circuit configuration for the execution of the method with a first housed IC S1 and a second housed IC S2. The first IC S1 is shows a monolithically integrated circuit on a semi conductor body S1 together with a magnetic field sensor MFS. Further, the first IC S1 includes a signal output OUT and a supply voltage connection VA and a reference connection GND. The purpose of the signal output OUT is to emit an output signal which depends on the signal tapped at the magnetic field sensor.

The second IC S2 includes a connection VP to provide a supply voltage VS and a bidirectional signal connection I/O and a reference connection GND. The second IC S2 includes a control unit CU which is not shown. It is understood that the control unit CU preferably includes a processor unit PR. The present supply voltage connection VA is interconnected with the connection in order to provide a supply voltage VP. Further, the signal output OUT is interconnected with the signal connection I/O, wherein the signal output OUT can be connected to a reference potential by means of the signal connection I/O. The reference potential can preferably be configured as ground potential GND or as supply voltage VS—each illustrated as dotted lines.

Figure 2:
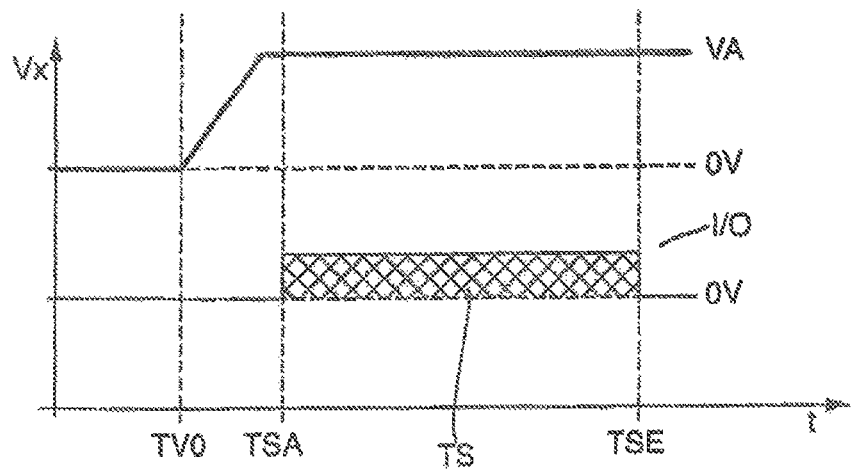
FIG. 2 is a diagram to illustrate the temporal voltage processes of the circuit configuration shown in FIG. 1.

The illustration of FIG. 2 shows a diagram with the temporal voltage processes of the circuit configuration shown in FIG. 1 in order to perform a switch at the first IC S1 from the normal operating state to a test mode state. In the present drawing, the voltage values Vx of the connections of the two ICs, S1 and S2, are plotted as a function of time t.

In order to perform a switch, in a first step the power supply is switched off via the control unit at the power supply connection VA of the first IC S1, and in a second step, the signal output OUT is connected with a ground potential GND. In a third step, the power supply of the first IC S1 is switched on at a point in time TVO and the voltage at the power supply connection VA reaches the predetermined value. In a fourth step, the signal output OUT is separated from the ground potential GND at a point in time TSA. In this way, a switch in the first IC S1 into the test mode state is achieved. It is understood that the separation of the signal output OUT only then takes place when the voltage has reached a stable state at the power supply connection VA.

Hereafter, a self-test is performed in the first IC S1 up to the point in time TSE and a test pattern is configured at the signal output OUT. The test pattern is evaluated by the control unit for the testing of the signal path.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for testing a signal path of a first housed IC that forms a monolithically integrated circuit on a semiconductor body together with a magnetic field sensor and has a signal output and a power supply connection and a test mode state and a normal operating state, wherein, during the normal operating state, an output signal is provided at the signal output, the output signal being dependent on a signal which is tapped at the magnetic field sensor, and a second housed IC is provided that is formed as a control unit, wherein via the control unit, a switch from the normal operating state to the test mode state is performed in the first housed IC, the method comprising:
   switching off, in a first step, the power supply of the first IC;
   connecting, in a second step, the signal output with a reference potential;
   switching on, in a third step, the power supply of the first IC;
   disconnecting, in a fourth step, the signal output from the reference potential; and
   performing, subsequently in the test mode state, a test of the first IC by the first IC such that a test pattern is configured at the signal output or at the power supply connection and the test pattern is evaluated by the control unit for testing of the signal path.

2. The method for testing a signal path according to claim 1, wherein between the third step and the fourth step the control unit waits a predetermined time and/or verification whether the power supply of the first IC is stable.

3. The method for testing a signal path according to claim 1, wherein the magnetic field sensor is interconnected with a current source of the power supply during the test mode state and a predetermined test current is provided to the magnetic field sensor.

4. The method for testing a signal path according to claim 3, wherein the magnetic field sensor has a plurality of connections and the current source is alternatingly interconnected with different connections of the magnetic field sensor during the test mode state.

5. The method for testing a signal path according to claim 4, wherein an influence of the magnetic field sensor under test is suppressed via switching.

6. The method for testing a signal path according to claim 1, wherein the first IC is arranged in a mounting fixture of an end device during testing of the signal path or is interconnected with the second IC in a field application.

7. The method for testing a signal path according to claim 1, wherein the first IC and the second IC are connected via exactly one two-wire transmission or exactly one three-wire transmission.

8. The method for testing a signal path according to claim 1, wherein the first IC is switched to the normal operating state without a trigger signal from the second IC after the test of the first IC is completed.

9. The method for testing a signal path according to claim 1, wherein a current sink and a current source are alternatingly applied to at least one connection of the magnetic field sensor.

10. The method for testing a signal path according to claim 1, wherein an offset voltage applied to the magnetic field sensor is determined by the control unit during the test mode state.

11. The method for testing a signal path according to claim 1, wherein the reference potential is configured as a ground potential or as a power supply potential.

12. The method for testing a signal path according to claim 1, wherein the magnetic field sensor is a hall plate.

* * * * *